United States Patent [19]

Grünbaum

[11] 4,384,493

[45] May 24, 1983

[54] TORQUE MEASURING DEVICE

[76] Inventor: Heinrich Grünbaum, Am Bollwerk 6, 4102 Binningen, Switzerland

[21] Appl. No.: 235,143

[22] Filed: Feb. 17, 1981

[30] Foreign Application Priority Data

Feb. 18, 1980 [CH] Switzerland .................. 1282/80

[51] Int. Cl.³ ............................................ G01L 3/02
[52] U.S. Cl. ................................................ 73/862.29
[58] Field of Search ......................... 73/862.29, 862.31

[56] References Cited

U.S. PATENT DOCUMENTS

| | | | |
|---|---|---|---|
| 3,389,596 | 6/1968 | Lion et al. | 73/862.29 X |
| 3,417,611 | 12/1968 | Dean et al. | 73/862.29 |
| 4,005,852 | 2/1977 | Schmitmeyer et al. | 73/862.29 X |
| 4,152,930 | 5/1979 | Fujimoto et al. | 73/862.29 |

FOREIGN PATENT DOCUMENTS 2444035  3/1976  Fed. Rep. of Germany ... 73/862.29

Primary Examiner—Charles A. Ruehl
Attorney, Agent, or Firm—Michael J. Striker

[57] ABSTRACT

The torque exerted by an electric motor upon its mounting flange is determined by measuring the reaction torque. For this purpose the motor housing is connected to the flange so that it has limited freedom of angular turning movement relative thereto, and such movement is detected by strain gauges or similar devices which yield a signal proportional to the degree of turning movement.

5 Claims, 2 Drawing Figures

TORQUE MEASURING DEVICE

BACKGROUND OF THE INVENTION

This invention relates to a device for measuring torque.

More particularly, the invention relates to a device for measuring the torque applied by an electric motor with mounting flange.

Devices of this type are needed where it is essential to monitor the drive torque of a production machine in order to insure the quality of the product being manufactured. Examples of this are stirring equipment, extruders, feed screws and machines for processing paper and foils of all types.

The devices known for this purpose are usually in form of components which connect the motor shaft with the shaft of the machine to be driven, via additional coupling elements. These known devices are expensive and require a substantial amount of space in direction lengthwise of the shafts being connected. In addition, when such a device is connected to the motor output shaft, nothing else can be connected thereto, which is a disadvantage because it is usually desirable or even necessary that the motor shaft be available for mounting such other components as transporting means, gears, mixing blades or the like. This disadvantage is particularly noticeable in connection with electric motors having a mounting flange, because they are directly mounted to the machine frame, reduction gearing, boiler or whatever, so that there is no space and hence no possibility to emplace the known torque measuring components.

SUMMARY OF THE INVENTION

Accordingly, it is an object of the invention to overcome the prior-art disadvantages.

A more particular object is to provide an improved torque measuring device which is of particular (but not exclusive) benefit for use with flange-type electric motors and does not require the use of the motor output shaft, leaving the same free for other purposes.

Another object is to provide a device of the type under discussion which is simple and inexpensive.

Pursuant to these and still other objects, one aspect of the invention resides in a torque measuring device which, briefly stated, may comprise means mounting a housing of an electric motor on a flange with limited freedom of angular displacement relative thereto; and means for sensing any relative angular displacement which results due to the reaction torque, and for generating a signal proportional to the degree of angular displacement.

It might, at first sight, appear that it would be advantageous to connect the motor and the mounting flange via elastically deformable webs which are provided with strain gauges. However, this is not practicable since such a construction could not only reduce the stability and structural strength of the motor, but could also be the cause of very bothersome vibrations.

Therefore, the connection of the two elements motor and flange must meet the following requirements:

(a) It must not permit any relative movement of the two elements, other than friction-free turning to avoid hysteresis; and (b) It must not reduce the stability of the unit (motor cum flange) created by this connection, below that of a normal flange-type motor.

To meet these requirements the invention further proposes to turnably connect the housing and flange via a no-play rolling-body track.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
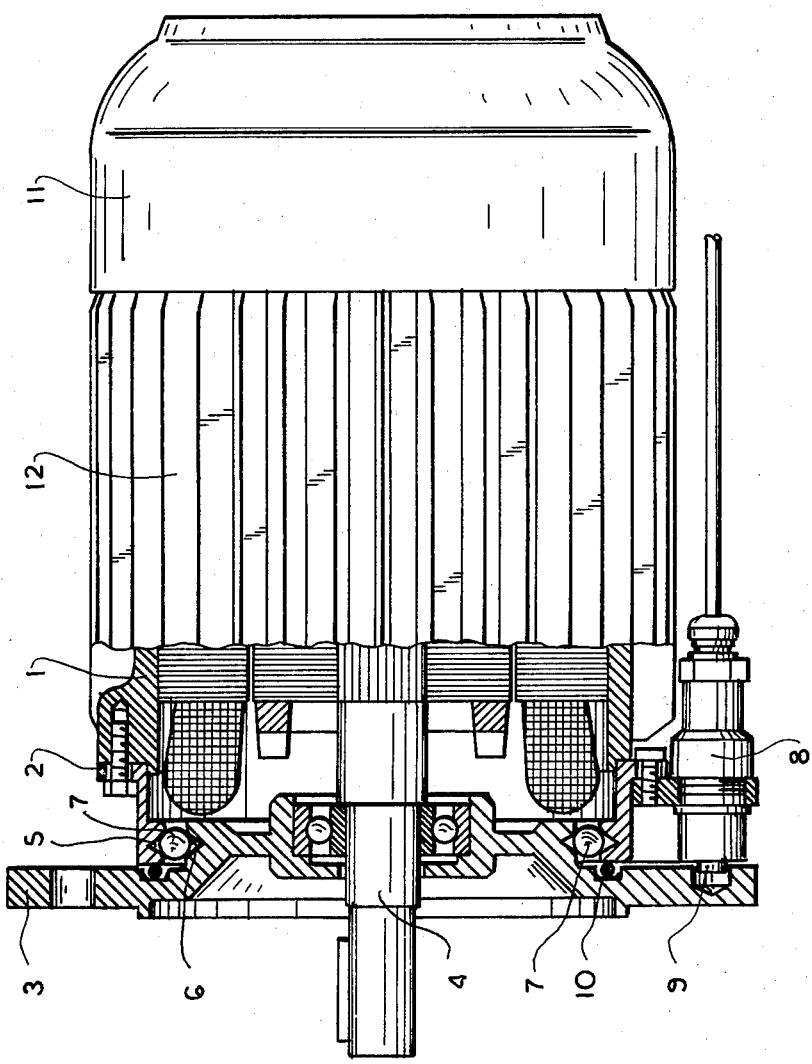
FIG. 1 is a side view, partly in axial section, of a first embodiment of the invention.

Referring firstly to FIG. 1, it will be seen that a motor housing 1 is provided into which the usual stack of sheet-metal laminations with the stator winding is press-fitted. Housing 1 has an extension 2 which is secured to it by screws so that they form a unit with one another. A mounting flange 3 carries a central anti-friction bearing in which the motor output shaft 4 is journalled. Shaft 4 has its own stack of sheet-metal laminations and shorting rings of the rotor bars (known per se). Via the gap between the two stacks of laminations the stator winding induces an alternating cement in the rotor bars and in this manner produces the drive torque which acts upon shaft 4 and which is to be measured.

From the introductory comments it will be remembered that the shaft 4 is to remain free of any connection to the torque measuring device. To achieve this the invention proposes to measure not the drive torque but the reaction torque which is of the same magnitude and which acts in the opposite sense upon the stator and thus upon the housing 1 and its extension 2.

For this purpose an annular groove 5 is formed in the extension 2; a similar annular groove 6 is formed in flange 3 and located opposite (within the confines of) groove 5. The two grooves together thus define a track in which a number of rolling bodies 7 (here bearing balls) is accommodated, so that the housing 1 and flange 3 are turnably connected with one another. In the embodiment of FIG. 1 this track with the bodies 7 forms a kind of radial bearing (in FIG. 2 it forms a kind of axial bearing).

An electric load cell 8 is connected to the extension 2 parallel to the axis of the motor; it has a bolt 9 which extends into a recess of flange 3 and onto which strain guages are adhesively secured.

If, due to the reaction torque and the turnable connection with flange 3, the housing 1 performs a (limited) angular turning movement relative to the flange 3, then the bolt 9 (which is dimensioned so that it can flex) undergoes such flexing. This is sensed by the strain gauges which produce an electrical signal that is proportional to the torque. Naturally, the angular movement is very small; for the maximum attainable signal it amounts to only 3–5 angular minutes. Therefore it is possible to seal the unavoidable gap between extension 2 and flange 3 by means of a soft-rubber ring 10. This ring does not cause any friction losses, but only becomes elastically deformed.

A fan rotates under the motor hood 11 and feeds cooling air over the cooling ribs 12 of the housing 1.

The flanks bounding the respective grooves 5 and 6 are straight and extend at a certain angle to one another. An angle of 90° is considered advantageous, because axial and radial forces are then both separated into respective force components. The bodies 7 are introduced into their track via one or more (not illustrated) openings which, it should be noted, are not needed in the embodiment of FIG. 2.

There must be no play between extension 2 and flange 3, i.e., no relative movement between them other than the aforementioned limited turning movement. In addition to this, it is desired that each of the bearing balls 7 exert optimum contact pressure at its four points of contact with the track defined by grooves 5 and 6. If this contact pressure is too low, then there is the danger that radial or axial play may develop which would move the motor shaft 4 out of alignment in its two bearings (only one shown). On the other hand, if the contact pressure is too high, then hysteresis will develop in the torque measurement. To obtain the desired optimum condition in the FIG. 1 embodiment, it is necessary to carefully polish the flanks of grooves 5, 6 and to carefully select appropriate bearing elements 7. Even then, however, optimum results are difficult to calculate numerically.

Figure 2:
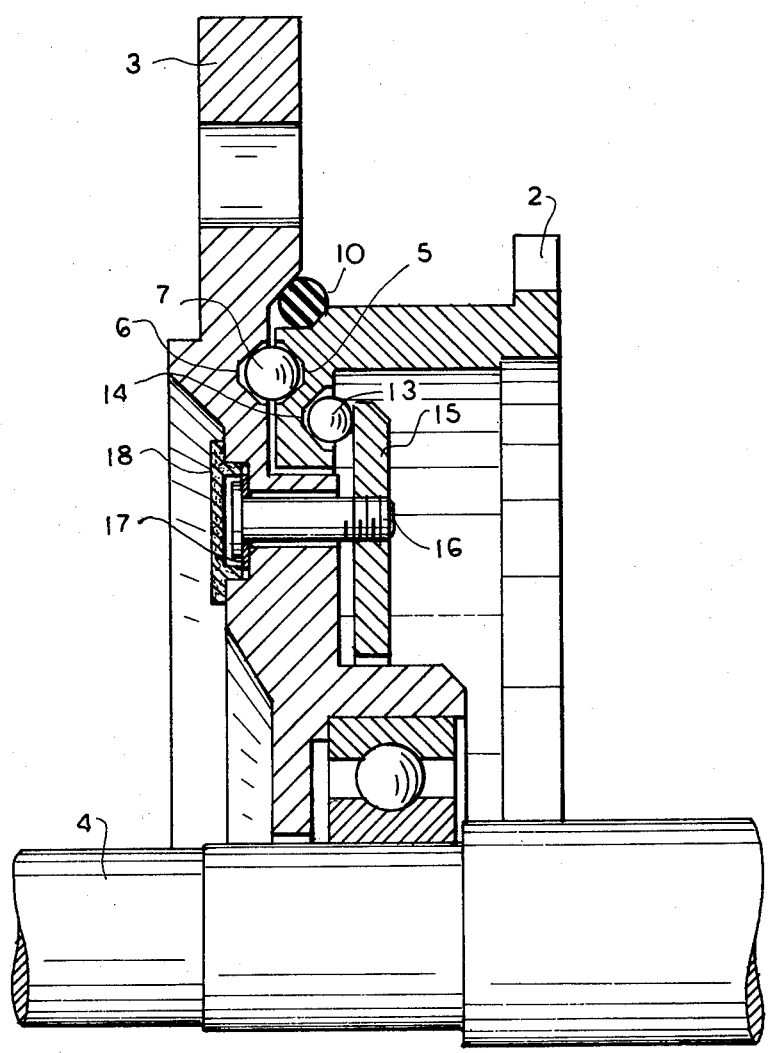
FIG. 2 is an axial sectional detail view of a second embodiment of the invention.

The somewhat more complicated embodiment of FIG. 2 is more advantageous in this respect. It should be understood that in respect of the elements which are not shown in FIG. 2, the FIG. 2 embodiment is the same as FIG. 1, and that like reference numerals identify like elements in both Figures.

FIG. 2 has an additional row of bearing balls 13 which are accommodated in an annular groove 14 of the extension 2 and are retained therein by a disk 15 against which they bear with a precisely defined force. This force is produced with the aid of several (one shown) angularly spaced screws 16 which act upon plate springs located in recesses of flange 3. The more the screws 16 are tightened, the more strongly the disk 15 presses against bearing balls 13. The thus exerted pressure is transmitted to grooves 5, 6 and bearing balls 7. The contact pressure of the bearing balls 7 is thus selectable. Caps 18 protect the interior of the motor against the entry of oil and contaminants.

In both embodiments I have illustrated the use of bearing balls. However, these could be replaced by conical rollers, cylindrical rollers or needles. Also, in lieu of a single rolling body track, two such tracks could be provided. The term "rolling body track" includes any commercial anti-friction bearing which meets the above-explained no-play requirement and which could then be used in lieu of the track 5, 6, 7 to establish the connection between housing 1 and flange 3.

The motor shown in FIG. 1 may be of the types known as B5, V1 or V3, depending upon whether the shaft 4 extends horizontally upwardly or downwardly. It could also be of the types B14, V18 and V19, again depending upon the shaft orientation; these latter types merely have a smaller flange 3 than the former types. The type designations are those prescribed in German Industrial Standard DIN 42950.

It will be appreciated that the invention is not limited to AC-induction motors or three phase motors, but can also be used with DC motors. These latter, of course, have a different measure for the torque they exert, the armature current. In the case of shunt-wound motors the relationship in linear, in the case of series-wound motors it is quadratic. This means that a torque measuring device will be needed only with these or with compound-wound motors. Induction motors, on the other hand, do not have such a convenient measure, due to the variable load factor.

The invention as illustrated and described is susceptible of a variety of modifications. For example, the anti-friction bearing journalling the shaft 4 could be mounted on the extension 2. The extension 2 could be eliminated as a separate element if the housing 1 were appropriately extended and configurated. the invention is not restricted to the use of a load cell of the type using strain gauges. It would be possible to use magneto-elastic, inductive, capacitive, piezo-electric, hydraulic or pneumatic systems, and these need not necessarily be mounted on the motor housing but could be mounted elsewhere, for example on the frame of the machine which is being driven by the electric motor.

The invention permits torque measurements but without requiring any kind of connection to the motor output shaft. Furthermore, the device according to the invention does not increase the outside dimensions of the electric motor, which is important because in many countries these dimensions are standardized. Moreover, the cost of making the device according to the invention, especially when compared to the known devices, is exceedingly small.

While the invention has been illustrated and described as embodied in a torque measuring device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. Device for measuring the torque exerted by an electric motor having a housing provided with an extension upon a mounting flange of the motor, comprising means mounting said motor housing on said flange with limited freedom of angular displacement relative thereto and including a rolling body track connecting said extension and flange with freedom of said angular displacement but without freedom of relative displacement in any other sense, said rolling body track including two concentric facing annular grooves in said extension and flange, respectively, and a series of rolling bodies confined in the space between said facing grooves; and means for sensing any relative angular displacement which results due to the reaction torque, and for generating a signal proportional to the degree of angular displacement, said grooves being arranged similar to a radial bearing, and said rolling bodies being bearing balls each engaging said extension and flange at four contact points.

2. Device for measuring the torque exerted by an electric motor having a housing provided with an extension upon a mounting flange of the motor, comprising means mounting said motor housing on said flange with limited freedom of angular displacement relative thereto and including a rolling body track connecting said extension and flange with freedom of said angular displacement but without freedom of relative displacement in any other sense, said rolling body track including two concentric facing annular grooves in said extension and flange, respectively, and a series of rolling bodies confined in the space between said facing grooves; and means for sensing any relative angular displacement which results due to the reaction torque, and for generating a signal proportional to the degree of angular displacement, said grooves being arranged similar to an axial bearing, and said rolling bodies being bearing balls each engaging said extension and flange at four contact points.

3. Device as defined in claim 2; and further comprising means for selectively adjusting the contact pressure at said four contact points between said bearing balls and said extension and flange.

4. Device as defined in claim 3, wherein said motor including a disk, said adjusting means including additional bearing balls positioned between said extension and said disk and a plurality of screws cooperating with said disk for adjusting pressure on said additional bearing balls, said pressure being transmitted to said first mentioned bearing balls via said extension.

5. Device as defined in claim 1 or 2, said flange having an axial recess facing said motor housing; and said sensing means comprising an electric load cell mounted at said housing parallel to an axis of said motor and having a resiliently deformable bolt extending into said recess and carrying strain gauges.

* * * * *